United States Patent [19]
McGann

[11] Patent Number: 5,124,665
[45] Date of Patent: Jun. 23, 1992

[54] CIRCUIT FOR REDUCING DISTORTION PRODUCED BY AN R.F. POWER AMPLIFIER

[75] Inventor: Melvyn McGann, Chelmsford, United Kingdom

[73] Assignee: The Marconi Company Limited, Stanmore, United Kingdom

[21] Appl. No.: 642,963

[22] Filed: Jan. 18, 1991

[30] Foreign Application Priority Data

Feb. 8, 1990 [GB] United Kingdom ............ 9002788

[51] Int. Cl.⁵ .............................. H03F 1/26
[52] U.S. Cl. ............................ 330/149; 455/126
[58] Field of Search ........... 330/107, 109, 129, 149; 332/159, 160, 161, 162; 455/115, 126

[56] References Cited

U.S. PATENT DOCUMENTS

| 3,900,823 | 8/1975 | Sokal et al. | 330/149 |
| 4,472,831 | 9/1984 | Yokoya | 332/159 X |
| 4,591,800 | 5/1986 | Opas | 330/149 X |

FOREIGN PATENT DOCUMENTS

| 1246209 | 9/1971 | United Kingdom. |
| 1474952 | 5/1977 | United Kingdom. |
| 2240889 | 8/1991 | United Kingdom. |
| 2240890 | 8/1991 | United Kingdom. |
| 2241622 | 9/1991 | United Kingdom. |

*Primary Examiner*—Steven Mottola
*Attorney, Agent, or Firm*—Spencer, Frank & Schneider

[57] ABSTRACT

A high frequency SSB radio transmitter has an envelope amplitude modulator for varying the envelope of an r.f. signal source based on an error signal from envelope detectors detecting the envelope of the input and output waveform. It also has a phase modulator for varying the phase of the input waveform based on differences detected in a second amplitude modulator between the instantaneous phase of the input and output r.f. signal. A signal derived from the error signal controls the second amplitude modulator in a subsidiary feedback loop to maintain the size of the envelopes detected by the detectors the same, in order that a difference amplifier may operate effectively. Rapid discrepancies between the detected envelopes occurring within an envelope can then be corrected by the envelope amplitude modulator.

13 Claims, 3 Drawing Sheets

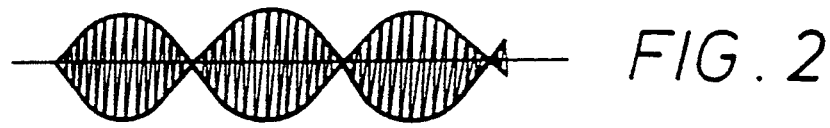
FIG. 2
FIG. 2a
FIG. 3
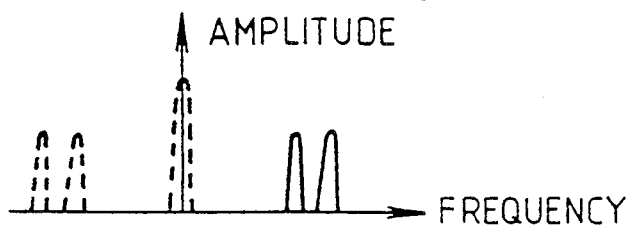
FIG. 4
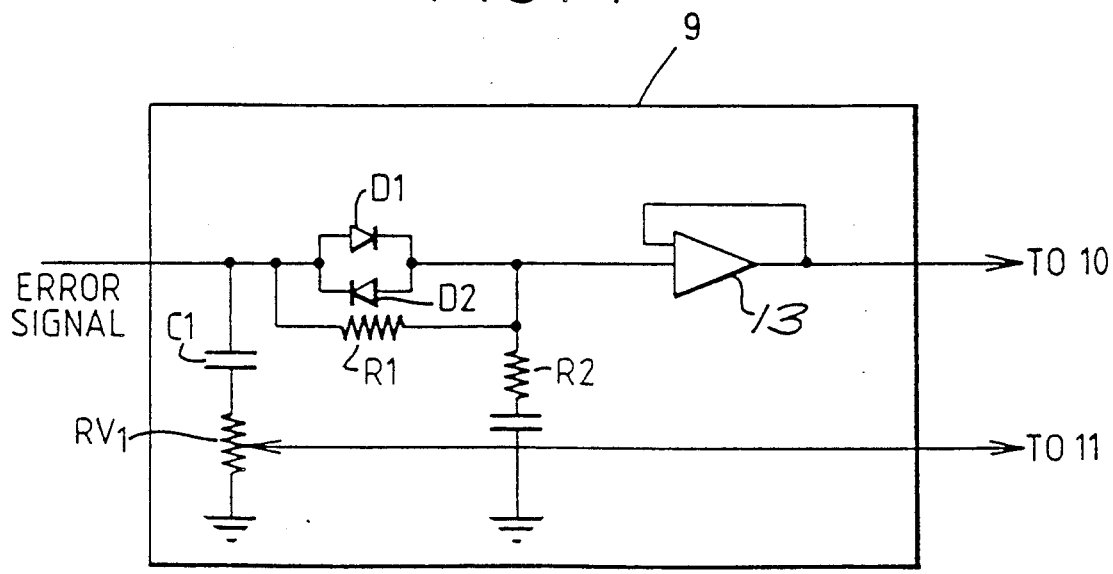

CIRCUIT FOR REDUCING DISTORTION PRODUCED BY AN R.F. POWER AMPLIFIER

BACKGROUND OF THE INVENTION

This invention relates to circuits for reducing distortion produced by an r.f. power amplifier, particularly but not exclusively for SSB (Single Side Band) transmitters.

When an r.f. signal is amplified, e.g. in a transmitter, any non-linearity in the amplifier will cause envelope amplitude and/or phase distortion of the output compared to the r.f. signal source (drive waveform). This will result in intermodulation distortion of the amplified r.f. signal.

It has been proposed (GB-A-1246209) to compensate for any distortion produced by an r.f. amplifier by separately correcting for envelope amplitude deviation and r.f. phase deviation between the power amplifier output and the drive waveform input. It is known (GB-A-1246209 and GB-A-1474952) to correct for envelope amplitude deviation by a feedback loop including envelope detector means for generating an error signal dependent on the difference between the envelope amplitudes of a signal derived from the power amplifier output and a signal derived from the r.f. signal source. The error signal modulates the envelope amplitude of the power amplifier input (which effectively alters the gain of the power amplifier) in such a manner as to reduce envelope distortion. Since the distortion component is extracted by assessing the difference between two envelope amplitudes, it follows that those amplitudes must be held the same in order that a signal representative of the rapid fluctuations between the two envelopes can be derived so that the distortion can be compensated for.

However, to detect the envelope amplitude of the power amplifier output requires a probe which will have a different amplitude response at different r.f. frequencies. Equally, the cable losses from the corrector unit to the transmitter output probe may vary with frequency. Consequently, to operate at different r.f. frequencies, adjustments must be made for each frequency to make the envelope amplitudes compared the same.

SUMMARY OF THE INVENTION

The invention provides a circuit for reducing envelope amplitude distortion produced by an r.f. power amplifier for an r.f. signal source, comprising a main feedback loop for reducing envelope amplitude errors between the output of the power amplifier and the r.f. signal source, the main feedback loop including envelope detector means for generating an error signal, dependent on the envelope amplitude of a signal derived from the power amplifier output relative to that of a signal derived from the r.f. signal source, a signal derived from the error signal being used to modulate the envelope amplitude of the power amplifier input, and a subsidiary feedback loop by means of which a signal derived from the error signal is used to modulate the envelope amplitude of an input to the envelope detector so as to tend to hold the inputs to the envelope detector means the same.

The subsidiary feedback loop compensates for variations in cable and probe losses with frequency, and permits operation of the distortion-reducing-circuit over a broad r.f. frequency range without the need for adjustments, while also compensating for losses which vary with ambient conditions. The subsidiary feedback loop holds the inputs to the envelope detector means the same, enabling the main feedback loop to compensate for the rapid envelope amplitude fluctuations. Any distortion produced in the envelope detector means can also be cancelled since the input envelope will only differ by a very small amount inversely proportional to the loop gain of the subsidiary loop.

There may be provided a steering network to which the error signal is fed, for steering a.c. components within a given amplitude along the main feedback loop for modulation of the envelope amplitude of the transmitter input and d.c. components along the subsidiary feedback loop for modulation the envelope amplitude of the input to the envelope detector. The steering network may include a pair of diodes in opposition. The a.c. component of a typical error signal can be arranged to be below the turn-on voltage of the diodes.

The invention is especially applicable to operation at medium frequencies or high frequencies or VHF (300 KHz to 300 MHz), and particularly applicable to medium or high frequencies (300 KHz to 30 MHz).

BRIEF DESCRIPTION OF THE DRAWINGS

A high frequency SSB radio transmitter constructed in accordance with the invention will now be described, by way of example, with reference to the accompanying drawings, in which:

FIG. 2 shows an SSB waveform of a two-tone test signal;

FIG. 2a shows the corresponding detected envelope;

FIG. 3 shows the corresponding frequency spectrum;

FIG. 4 shows one form which the divider circuit in FIG. 1 can take; and

DESCRIPTION OF THE PREFERRED EMBODIMENTS

Figure 1:
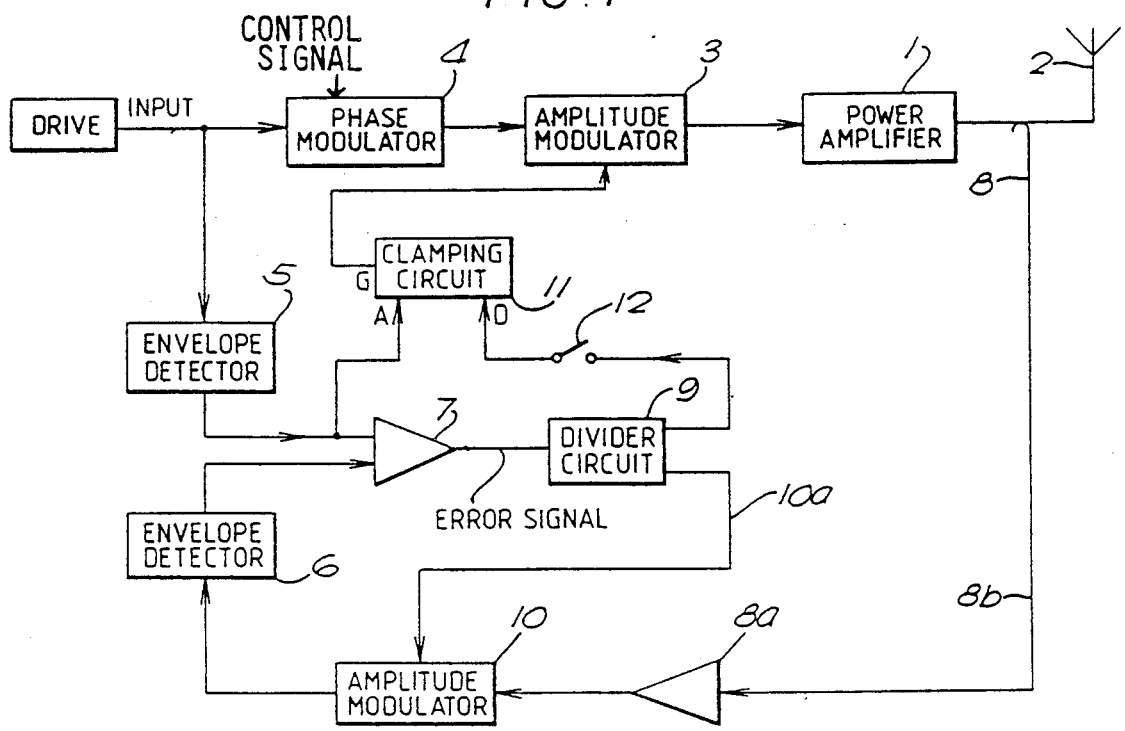
FIG. 1 is a block diagram of a part of the high frequency radio transmitter.

The radio transmitter generates an r.f. signal source in the form of an SSB drive waveform, for example, the test signal of FIGS. 2 and 3. This is produced by amplitude modulating a pair of audio frequencies of equal amplitude onto a carrier, and then filtering one of the sidebands and the carrier (shown dotted) from the signal. Power amplification takes place at a power amplifier 1 feeding an antenna 2.

The transmitter is relatively high power and, even though the power amplifier consists of a series of linear amplifiers, it is prone to exhibit non-linearity and distort the drive waveform. This would be manifested, in the case of a test signal of two pure audio tones of 1 KHz and 2 KHz of equal amplitude modulated onto the carrier, as various additional lines (intermodulation products) in the frequency spectrum of the power amplifier and hence transmitter output apart from those corresponding to the two audio tones. The additional lines must be suppressed below defined limits in order to avoid interference with adjacent radio channels, and also to reduce distortion in the recovered audio signal. The invention aims to reduce or eliminate this distortion by separately applying relative envelope amplitude and relative phase error signals to amplitude modulator 3 and phase modulator 4.

A suitable circuit for controlling phase modulator 4 is disclosed and claimed in our co-pending British patent application number 902789.7 and in copending U.S. application Ser. No. 07/653,010 filed Jan. 30, 1991, and other parts of the circuit are claimed in our co-pending British patent application numbers 9002786.3 and 9002787.1.

The circuit for reducing envelope amplitude distortion comprises a main feedback loop 8b feeding amplitude modulator 3 which includes envelope detector means consisting of envelope detector 5 for demodulating the drive waveform and envelope detector 6 for demodulating a signal derived from the power amplifier output, together with a difference amplifier 7 amplifying the difference between the envelopes, thereby generating an error signal. A signal derived from the error signal controls amplitude modulator 3 in such a way as to reduce dynamic envelope amplitude errors.

The output of detector 5 corresponding to the drive waveform shown in FIG. 2 is shown in FIG. 2a. The output of detector 6 corresponding to the signal derived from the power amplifier output is of the same form but will be distorted relative to the envelope shown in FIG. 2a. The distortions are of two kinds. First, the signal is derived from the power amplifier output by probe 8 which is a pick-up and the overall signal level, after amplifier 8a, will be different from that at the input and, since its response varies with frequency, the overall signal level will be different at different frequencies. The second kind of distortion consists of dynamic variations in envelope amplitude over the course of each envelope between cross-overs due to non-linearity in the power amplifier 1.

It will be apparent that the first kind of distortion creates problems when it is desired to compensate for the second kind of distortion, in that it is necessary to bring the output of detector 6 to the same level as that of detector 5 to be able to subtract the envelopes to obtain a signal characteristic of amplitude variations over an envelope cycle.

In accordance with the invention, the signal derived from the error signal is fed via divider circuit 9 (which will be referred to hereinafter) to an amplitude modulator 10 which provides a subsidiary, local amplitude lock loop 10a (which may also be regarded as an automatic gain control) for the envelope detecting means 5, 6, 7. Thus, if the amplitude of the output of detector 6 is less than that of detector 5, the gain of the amplitude modulator 10 increases until the outputs are the same. If desired, the amplitude modulator 10 could be placed between the envelope detector 5 and the drive input. The subsidiary loop compensates for variations in cable and probe losses with frequency and with ambient conditions i.e. temperature. Slow gain changes of the amplifier are indistinguishable from changes in the cable etc, and so cannot be compensated for. The subsidiary loop holds the output of detectors 5, 6 the same at all times, since the subsidiary loop can have a much wider bandwidth than that of the main feedback loop and hence a high subsidiary loop gain even at high r.f. frequencies, since the correction products introduced into the r.f. signal in the subsidiary loop (unlike those introduced into the main feedback loop which has a roll-off) do not have to go through the power amplifier and be delayed and/or have their bandwidth limited (e.g. by tuned circuits or physical cable lengths), before reaching the envelope detector 6.

An advantage of this arrangement is that the two detectors always see almost exactly the same input envelope irrespective of the transmitter distortion, and so any distortion they themselves produce will have equal and opposite effects and will cancel.

The envelope detectors are implemented as quasi-synchronous demodulators, where diodes are switched by an external carrier of large and constant amplitude.

Figure 1A:
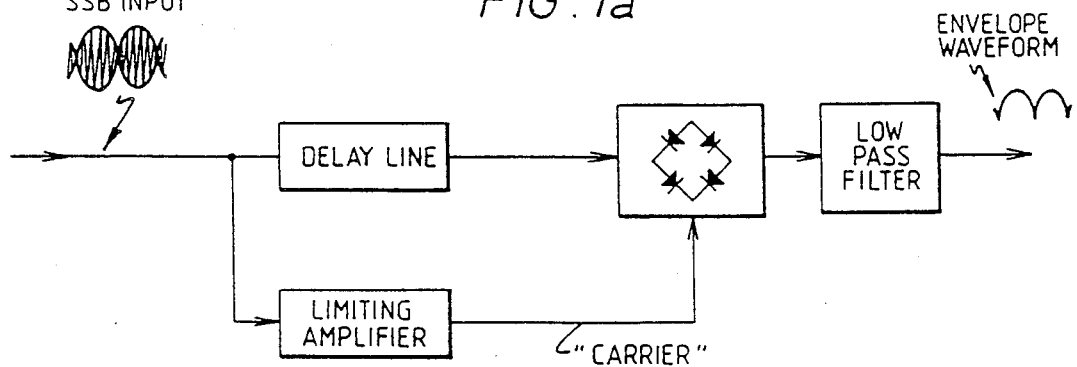
FIG. 1a shows one implementation of the envelope detectors of FIG. 1.

A block diagram of the arrangement is shown in FIG. 1a.

It will be seen that the "carrier" is produced from the SSB input signal by a limiting amplifier. This means that the phase of the carrier reaching the diodes will always be perfectly coincident with that existing at any instant within the SSB signal. The limiting amplifier has to be carefully designed to introduce the minimum phase-shift with amplitude; this is important, as any phase differences can cause the output amplitude to vary, and so introduce distortion. The propagation delay of the limiting amplifier is compensated for by a delay line, so that the same amplitude output is obtained over the whole frequency range.

At carrier breaks, the limiting amplifier will of course have no input and so its output will be indeterminate; the greater the degree of limiting, the shorter the period of indeterminacy. In practice, it is found that a gain of approximately 60 dB gives a satisfactory compromise between output waveform distortion and spurious signal pickup.

The output of the circuit is purely a measure of the instantaneous amplitude of the input r.f. envelope and completely independent of the instantaneous phase of the r.f. signal within it. The diodes are followed by a filter to remove any residual r.f. components. This filter has as wide a bandwidth as possible to preserve the high frequencies contained within the sharp corners of the envelope waveform which can appear, for example, at the instantaneous carrier breaks.

While the inputs to the differential amplifier are almost the same due to the subsidiary feedback loop 10a, the error signal is sufficiently large to drive amplitude modulators 3 and 10 since the error signal is the product of the difference between the inputs and the large amplifier gain of the difference amplifier 7.

It is apparent that the error signal cannot simply be shared between the modulators, as otherwise full amplitude correction of amplitude modulator 3 would not be provided. For this reason, a steering network is provided.

Referring to FIG. 4, the error signal is fed to amplitude modulator 3 via a clamping circuit 11 and switch 12, and via a loop gain control comprising a d.c. blocking capacitor Cl and a potentiometer $RV_1$. The capacitor Cl isolates the amplitude modulator 3 from the d.c. component in the error signal and $RV_1$ is manually adjustable so that the amount of error signal fed to amplitude modulator 3 can be varied, thereby adjusting the amount of distortion reduction achieved.

Diodes D1 and D2 connected in anti-parallel (if desired series opposed Zener diodes could be used), and in parallel with resistor R1, have a forward turn-on voltage of the order of 0.7 volt, and so a.c. fluctuations of the error signal within this amplitude will be steered to the loop gain control and hence amplitude modulator 3. The values of R1 and R2 are chosen to prevent any substantial a.c. signal passing the diodes via resistor R1.

The d.c. component of the error signal is not blocked by the diodes and by buffer 13, and is the control signal for amplitude modulator 10.

Thus, in normal operation, the a.c. component of the error signal has a peak-to-peak amplitude of around 1 volt and is steered away from the amplitude modulator 10, and to amplitude modulator 3. The d.c. component of the error signal cannot pass to amplitude modulator 3 but does pass to amplitude modulator 10. Thus, discrepancies in the amplitudes of the envelope detected by envelope detectors 5, 6 are corrected by amplitude modulator 10, but not distortions in the shape of the envelope. These are corrected by amplitude modulator 3. It is generally convenient in a transmitter to be able to switch off corrections applied to the drive waveform, and the switch 12 is provided for this purpose. An advantage of the local amplitude lock loop via amplitude modulator 10 is that, after the switch 12 has been opened, the differential amplifier 7 stays operating within its limits, all the correction for the differences between the outputs of detectors 5, 6 being provided by the amplitude modulator 10. In this case, detector 6 initially represents the uncorrected output of the transmitter, so that the error signal will have an a.c. component greater than the bias of the diodes, so that the amplitude modulator 10 alone will correct for both the shape (a.c. components) and size (d.c. components) of the envelope. This means that the amplifier 7 does not limit while switch 12 is open, ensuring that correction can be smoothly restored when switch 12 is closed and the loop gain control is gradually increased.

Thus, when switch 12 is closed, and potentiometer $RV_1$ is adjusted so that the loop gain is gradually increased, the amount of error signal fed to amplitude modulator 3 is gradually increased. Consequently, amplitude correction gradually takes place and the error signal reduces accordingly. Eventually a point is reached where the a.c. component of the error signal is less than the bias of the diodes D1, D2, and full correction for amplitude distortion is provided by amplitude modulator 3, amplitude modulator 10 receiving the d.c. component only of the error signal to bring the envelopes to the same level.

The purpose of the clamping circuit 11 is to restore the d.c. level of the a.c. component of the error signal. The reason for this is that the transmitter amplifies at its maximum rated value at the peaks of the amplitude envelope, which are consequently limited to a carefully controlled maximum peak-to-peak value. If a d.c. level was superimposed on the a.c. correction signal, the amplifier would amplify the envelope to a greater level than the maximum rated output, and distortion would be caused. Also, the peak output might tend to vary as the correction was applied, which is undesirable. Accordingly, the clamping circuit clamps at zero volts those points on the error signal corresponding to the peaks of the drive waveform. (The clamping could in principle be to any fixed voltage). This is achieved by the use of four differential operational amplifiers A1 to A4 as shown in FIG. 5.

Figure 5:
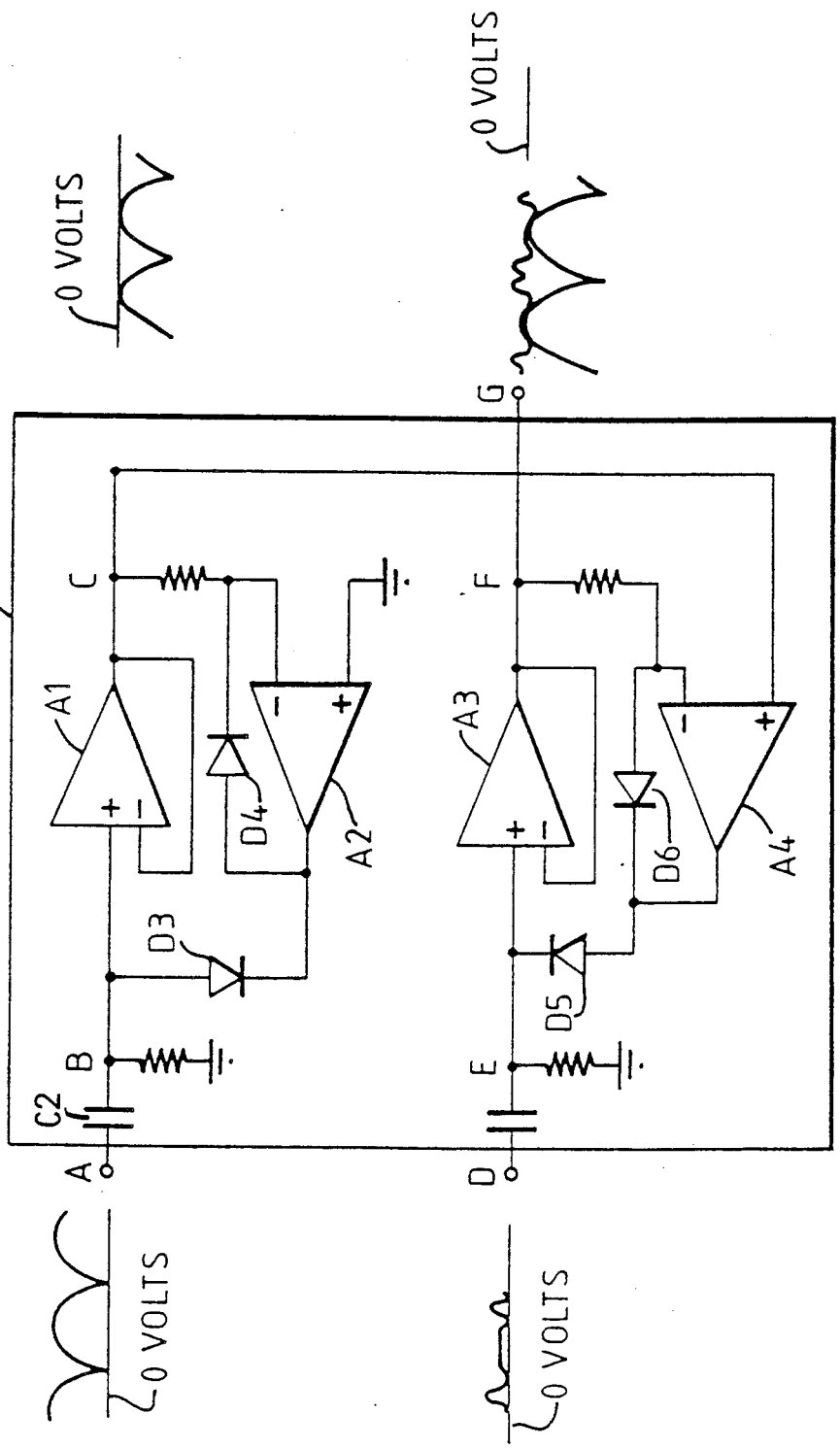
FIG. 5 shows one form which the clamping circuit in FIG. 1 can take.

Referring to FIG. 5, A1 is an operational amplifier acting as a voltage follower such that the voltage at point C follows the voltage at point B. Operational amplifier A2 holds the level of B below its reference voltage of ground, since the non-inverting input is grounded. If the voltage at B tries to go positive, an equal negative voltage is created at B by the output of operational amplifier A2 since that positive excursion appears via C at its inverting input, with the result that the voltage at B cannot go above zero. Hence, the detected waveform at A from which the d.c. components is being removed by capacitor C2 is clamped at B so that it cannot go above zero.

Operational amplifiers A3 and A4 have diodes D5, D6 connected in the opposite direction to diodes D3, D4 and would, if the same reference of ground was applied to the non-inverting input of operational amplifier A4, hold the voltage at points E and F such that it could not fall below zero. A3 is again a buffer. This time, however, the reference applied to the non-inverting input is the output at C, and the input at D is the a.c. component of the error signal. Hence what happens is that the error signal cannot fall below the detected envelope signal and, since this is zero at its peaks, the error signal cannot fall below zero at the points corresponding to the peaks of the detected envelope i.e. the error signal is clamped to zero at the desired points, and may vary above or below zero volts at any other time.

The transmitter could operate at between 3.9 and 28 MHz and its power could be 500 kW. However, the invention is applicable to any high frequency or medium frequency transmitter. It will be apparent that the compensation circuit may be built into a transmitter, but that it also may be connected to an existing transmitter. Also, the circuit described could form part of any type of transmitter e.g. reduced carrier operation, a.m., f.m., or TV or radar. Further, the circuit may be used for r.f. power amplifiers which are not part of a transmitter but serve some other function. The invention is applicable for reducing or eliminating amplitude distortion in any linear power amplifier e.g. class A, B or class AB.

I claim:

1. A circuit for reducing envelope amplitude distortion produced by an r.f. power amplifier, said r.f. power amplifier having an input and an output, for an r.f. signal source, comprising a main feedback loop for reducing envelope amplitude errors between the output of the power amplifier and the r.f. signal source, the main feedback loop including envelope detector means for generating an error signal, dependent on the envelope amplitude of a signal derived from the power amplifier output and received at a first input of said envelope detector means relative to that of a signal derived from the r.f. signal source and received at a second input of the envelope detector means, a signal derived from the error signal being used to modulate the envelope amplitude of the power amplifier input, and a subsidiary feedback loop by means of which a signal derived from the error signal is used to modulate the envelope amplitude of one input to the envelope detector means so as to tend to hold both inputs to the envelope detector means the same.

2. A circuit as claimed in claim 1, including a steering network to which the error signal is fed, for steering a.c. components below a given amplitude along the main feedback loop for modulation of the envelope amplitude of the power amplifier input and for steering d.c. components along the subsidiary feedback loop for modulating the envelope amplitude of the input to the envelope detector means.

3. A circuit as claimed in claim 2, in which the steering network is such that a.c. components above the said given amplitude pass along the subsidiary feedback loop.

4. A circuit as claimed in claim 2, in which the steering network includes a pair of diodes in opposition.

5. A circuit as claimed in claim including means for varying the amount of signal derived from the error signal that is used to be fed along the main feedback loop.

6. A circuit as claimed in claim 1, including a clamping circuit for clamping the signal which is used to modulate the envelope amplitude of the power amplifier input.

7. A circuit as claimed in claim 6, in which the clamping circuit is arranged to clamp the signal at a fixed voltage at times corresponding to the peaks of the r.f. signal source.

8. A circuit as claimed in claim 1, in which the envelope detector means comprises a pair of detectors comprising diodes switched by a signal of constant amplitude of carrier frequency derived from the r.f. signal source.

9. A circuit as claimed in claim 1, in which the power amplifier is suitable for use in a transmitter.

10. A circuit as claimed in claim 9, in which the power amplifier is suitable for use in an SSB transmitter.

11. A circuit for reducing envelope amplitude distortion produced at an output of an r.f. power amplifier in response to a signal applied to an input thereof from an r.f. source, comprising envelope detector means having a first input coupled to the output of said power amplifier and a second input coupled to said r.f. source, said envelope detector means generating an error signal at an output thereof which is dependent on the envelope amplitude of a signal received from said power amplifier at the first input thereof and on a signal received from said r.f. source at the second input thereof;

a first amplitude modulator interposed between said r.f. source and said power amplifier, said first amplitude modulator having a first input coupled to said r.f. source and an output coupled to the input of said power amplifier;

a second amplitude modulator interposed between the output of said power amplifier and the first input of said envelope detector means, said second amplitude modulator having a first input coupled to the output of said power amplifier and an output coupled to the first input of said envelope detector means; and means coupling the error signal at the output of said envelope detector means to second inputs of said first and second amplitude modulators thereby modulating the envelope amplitude of the signal at the input of said power amplifier and the signal at the first input of said envelope detector means, whereby the signals received at the first and second inputs of said envelope detector means tend to be the same.

12. A circuit as claimed in claim 11 wherein a divider circuit is interposed between the output of said envelope detector means and the second inputs of said first and second amplitude modulators, a.c. components of said error signal below a given amplitude being coupled by said divider circuit to the second input of said first amplitude modulator for modulation of the envelope amplitude at the input of said power amplifier, and a.c. and d.c. components of said error signal being coupled by said divider circuit to the second input of said second amplitude modulator for modulation of the envelope amplitude of the second input to the envelope detector means, the amplitude of the a.c. components of said error signal coupled to the second input of said second amplitude modulator being above said given amplitude.

13. A circuit as claimed in claim 12 wherein a clamping circuit is interposed between said divider circuit and the second input of said first amplitude modulator, said clamping circuit clamping the signal applied to the second input of said second amplitude modulator at a fixed voltage at times corresponding to the peaks of the signal from said r.f. signal source.

* * * * *